United States Patent
Mantey et al.

(10) Patent No.: US 7,039,892 B2
(45) Date of Patent: *May 2, 2006

(54) SYSTEMS AND METHODS FOR ENSURING CORRECT CONNECTIVITY BETWEEN CIRCUIT DESIGNS

(75) Inventors: Paul John Mantey, Spring, TX (US); John S. Atkinson, Ft. Collins, CO (US); Michael John Erickson, Loveland, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 308 days.

This patent is subject to a terminal disclaimer.

(21) Appl. No.: 10/643,397

(22) Filed: Aug. 19, 2003

(65) Prior Publication Data

US 2004/0034842 A1    Feb. 19, 2004

Related U.S. Application Data

(63) Continuation-in-part of application No. 09/911,997, filed on Jul. 24, 2001, now Pat. No. 6,629,307.

(51) Int. Cl.
*G06F 17/50* (2006.01)

(52) U.S. Cl. .............................. 716/15; 716/13; 716/14; 716/16

(58) Field of Classification Search ............. 716/13–16
See application file for complete search history.

(56) References Cited

U.S. PATENT DOCUMENTS

| 4,613,941 | A |  | 9/1986 | Smith et al. |
| 5,404,475 | A |  | 4/1995 | Fujisono et al. |
| 5,502,621 | A |  | 3/1996 | Schumacher et al. |
| 5,841,664 | A |  | 11/1998 | Cai et al. |
| 6,446,251 | B1 | * | 9/2002 | Gardner et al. ............... 716/18 |
| 6,578,174 | B1 | * | 6/2003 | Zizzo ........................... 716/1 |
| 6,581,191 | B1 | * | 6/2003 | Schubert et al. .............. 716/4 |
| 6,757,882 | B1 | * | 6/2004 | Chen et al. ................... 716/12 |
| 6,898,775 | B1 | * | 5/2005 | Erickson et al. ............. 716/15 |
| 6,907,587 | B1 | * | 6/2005 | Rittman et al. ................ 716/5 |
| 2003/0084418 | A1 | * | 5/2003 | Regan ......................... 716/14 |

OTHER PUBLICATIONS

Nakamura et al, "Lores—Logic Reorganization System", Proceedings of the Fifteenth Design Automation Conference, Las Vegas, NV, 1978, pp. 250-260.*

* cited by examiner

*Primary Examiner*—Stacy A. Whitmore
*Assistant Examiner*—Magid Y. Dimyan

(57) ABSTRACT

Systems, methods and software products ensure correct connectivity between circuit designs. A list of connections of the circuit designs is generated. One or more mapping files are generated from the list to correlate connections between the circuit designs. The mapping file is regenerated in response to modification of at least one of the circuit designs. Optionally, at least one schematic associated with at least one of the circuit designs is regenerated using information in the regenerated mapping file

20 Claims, 5 Drawing Sheets

| | FROM SIGNAL | FROM DESIGN | FROM CONN | FROM PIN | TO SIGNAL | TO DESIGN | TO CONN | TO PIN |
|---|---|---|---|---|---|---|---|---|
| 27 | SA | 32A | 33A | P0 | SA | 32B | 33B | P0 |
| 29 | SB | 32A | 33A | P1 | SD | 32B | 33B | P1 |

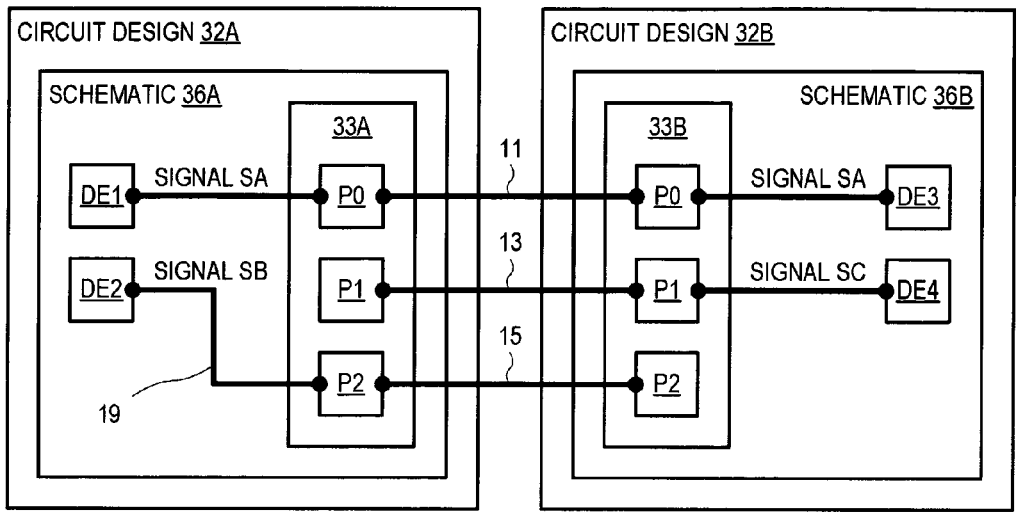
FIGURE 4
| FROM SIGNAL | FROM DESIGN | FROM CONN | FROM PIN | TO SIGNAL | TO DESIGN | TO CONN | TO PIN |
|---|---|---|---|---|---|---|---|
| SA | 32A | 33A | P0 | SA | 32B | 33B | P0 |
| SB | 32A | 33A | P2 | SD | 32B | 33B | P2 |
FIGURE 5
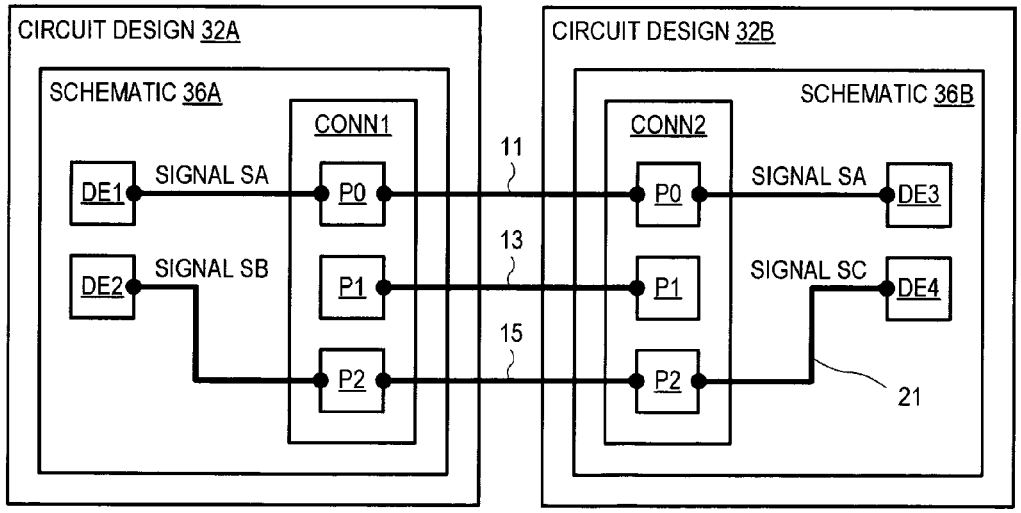
FIGURE 6

SYSTEMS AND METHODS FOR ENSURING CORRECT CONNECTIVITY BETWEEN CIRCUIT DESIGNS

CROSS-REFERENCE TO RELATED APPLICATIONS

This application is a continuation-in-part of application Ser. No. 09/911,997 filed Jul. 24, 2001, now U. S. Pat. No. 6,629,307, entitled "Method For Ensuring Correct Pin Assignments Between System Board Connections Using Common Mapping Files", which is incorporated herein by reference.

BACKGROUND

A computer aided design ("CAD") tool is used to create circuit designs for complex electronic products consisting of two or more interconnected circuit boards, such as personal computers and servers. The circuit designs for each printed circuit board are often created by different design engineers. The design engineers agree upon interconnectivity, and then each printed circuit board design is independently created with one or more connectors to accommodate signal connections between the printed circuit boards (and optionally between the printed circuit boards and other components of the electronic product). Physical pins of the connectors are identified by their corresponding pin numbers and are assigned to signal names of connecting signals for printed circuit board interconnectivity.

During development of the product, the printed circuit board interconnectivity is verified by the design engineers for correct geometry, orientation and pin-to-signal assignment: the geometry and orientation verifications involve the physical attributes of the printed circuit boards and parts; the pin assignment verification involves manual tracing of signal pathways through the pins of the connectors and through the underlying printed circuit boards. Since signal names often vary from one printed circuit board to another, and since the connections to any given board may be very dense and complex, the signal and pin assignment verification process has become increasingly difficult.

Design changes are typically communicated between the design engineers, each design engineer being responsible for making appropriate changes to the printed circuit boards within their responsibility. Such changes are easily missed or made erroneously. Further, errors in pin assignment, or in signal associations to pins, are easily missed in schematic reviews, particularly as printed circuit board connectors increase in density and size. In the development of large systems that include many interconnected boards, one of the most common problems involves misconnected signals between printed circuit boards.

SUMMARY

In one embodiment, a system ensures correct connectivity between circuit designs. Configuration files define connections of the circuit designs. At least one mapping file correlates connections between the configuration files. A processing section updates the mapping file in response to changes of the circuit designs, and processes the configuration files and the mapping file in generating the circuit designs.

In another embodiment, a system ensures correct connectivity between circuit designs including: means for generating at least one mapping file, to correlate connections between configuration files of the circuit designs; means for updating the mapping file in response to a change of the circuit design; and means for processing the configuration files and the mapping file in generating the circuit designs.

In another embodiment, a method ensures correct connectivity between circuit designs. A list of connections of the circuit designs is generated. A mapping file is generated from the list, to correlate connections between circuit designs. The mapping file is re-generated in response to modification of at least one of the circuit designs.

In another embodiment, a software product has of instructions, stored on computer-readable media, wherein the instructions, when executed by a computer, perform steps for ensuring correct connectivity between circuit designs, including: instructions for generating a list of connections of the circuit designs; instructions for generating a mapping file from the list, to correlate connections between the circuit designs; and instructions for re-generating the mapping file in response to modification of at least one of the circuit designs.

BRIEF DESCRIPTION OF THE DRAWINGS

FIG. 4 illustrates a modification to one circuit design affecting connectivity to a second circuit design.

FIG. 5 illustrates updates to the mapping file of FIG. 2 resulting from the modification of FIG. 4.

FIG. 6 illustrates modification to the second circuit design of FIG. 4 resulting from connectivity changes to the first circuit design.

DETAILED DESCRIPTION

Figure 1:
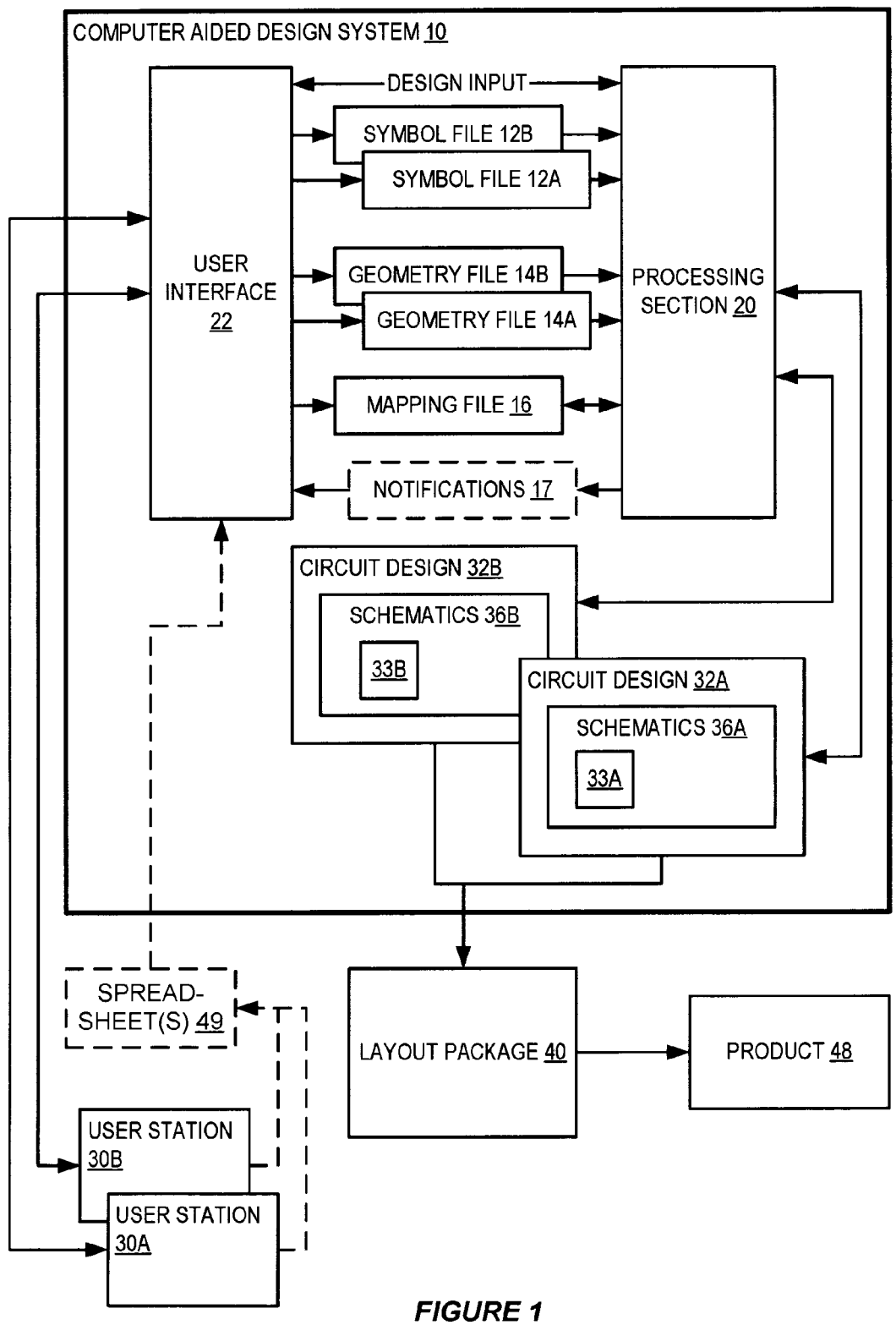
FIG. 1 shows one system for ensuring correct connectivity between circuit designs.

FIG. 1 shows one computer aided design ("CAD") system 10 that ensures correct connectivity between circuit designs. In exemplary operation of CAD system 10, one or more design engineers utilize one or more user stations (e.g., personal computers) 30 to interact with CAD system 10 through a user interface 22. For example, the design engineers operate CAD system 10 to create one or more symbol files 12, one or more geometry files 14, and at least one mapping file 16 (symbol files 12 and geometry files 14 collectively "configuration files"). In one embodiment, the design engineers agree upon connections between circuit designs and collectively create one or more spreadsheets 49 containing connectivity information in list form. Spreadsheet 49 may then be input to user interface 22 to create mapping file 16, as described more fully below. Spreadsheet 49 is used as an example; the connectivity information may be created as a list or other data structures in other types of files using an appropriate software tool.

A processing section 20 of CAD system 10 processes symbol files 12, geometry files 14 and mapping file 16 in generating one or more circuit designs 32. Processing section 20 is for example a single processor, a processor array or a distributed processing environment. In one embodiment, processing section 20 uses information from mapping file 16 to initially create circuit designs 32. In one optional embodiment, processing section 20 generates schematics 36, which, for example, define signals and connectivity of circuit design 32.

Circuit designs 32 are utilized by a layout package 40 to produce a final product 48. For example, circuit designs 32 may be used by layout package 40 to produce one or more printed circuit boards, representing product 48 and corresponding to circuit designs 32. In one example, circuit design 32A represents a backplane within a complex server system, and circuit design 32B corresponds to a circuit board interconnecting with the backplane of circuit design 32A.

Symbol files 12 define one or more parts of circuit designs 32. In one example, symbol file 12A defines a connector 33A within circuit design 32A and symbol 12B defines a connector 33B within circuit design 32B. Within symbol files 12, pins on the defined parts are described by pin names and, optionally, by pin numbers correlated to pins within an associated geometry file (described below).

It should be appreciated that, in this example, connectors 33A and 33B provide signal connectivity between circuit design 32A and 32B. A data communication path (e.g., bus, optical cable, etc.) physically connects between connectors 33A and 33B to implement this signal connectivity. Alternatively, connectors 33A and 33B may also represent contacts that physically interface with other devices to provide the signal connectivity between circuit designs 32A and 32B. Upon reading and fully appreciating this disclosure, those of ordinary skill in the art appreciate that other symbol files 12 may be included within system 10 to represent additional parts within circuit designs 32.

Geometry files 14 define physical characteristics of one or more parts of circuit designs 32, and may define circuit board attributes required to accommodate these parts. In one example, geometry file 14A defines physical characteristics of connector 33A, and physical attributes for connector 33A with the underlying circuit design 32A; geometry file 14B represents physical characteristics of connector 33B, and physical attributes for connector 33B with the underlying circuit design 32B. Upon reading and fully appreciating this disclosure, those of ordinary skill in the art appreciate that additional geometry files 14 may be included within system 10 to geometrically define additional parts within circuit designs 32.

Mapping file 16 correlates connections between circuit designs 32. For example, mapping file 16 defines signal connectivity between circuit designs 32A and 32B using connectors 33A and 33B. In one embodiment, mapping file 16 identifies connectivity between pin names (or pin numbers) of symbol and geometry files 12A, 14A, and symbol and geometry files 12B, 14B, respectively. Upon reading and fully appreciating this disclosure, those of ordinary skill in the art appreciate that additional mapping files 16 may be included within system 10 to define signal connectivity between additional parts of circuit designs 32.

In an operational example of system 10, design responsibility for circuit designs 32A and 32B may be assigned to different design engineers, a first design engineer at user station 30A having design responsibility for circuit design 32A and a second design engineer at user station 30B having design responsibility for circuit design 32B. The design engineers collaborate to generate a list of signals and connectivity between circuit designs 32A and 32B for input to CAD system 10 through user interface 22. For example, the design engineers create spreadsheet 49 listing signals and connectivity between circuit design 32A and circuit design 32B. CAD system 10 utilizes spreadsheet 49 to generate mapping file 16 and operates to facilitate the design process by ensuring connectivity between circuit designs 32.

In one embodiment, processing section 20 interacts with the design engineers and user stations 30 via user interface 22 to generate schematics 36 of circuit designs 32. By way of example, processing section 20 interacts with the first design engineer at user station 30A to generate schematic 36A for circuit design 32A. Similarly, processing section 20 interacts with the second design engineer at user station 30B via user interface 22 to generate schematic 36B for circuit design 32B. Processing section 20 may further interact with the design engineers to implement modification of schematics 36, and, hence of circuit designs 32.

Figures 2, 3:
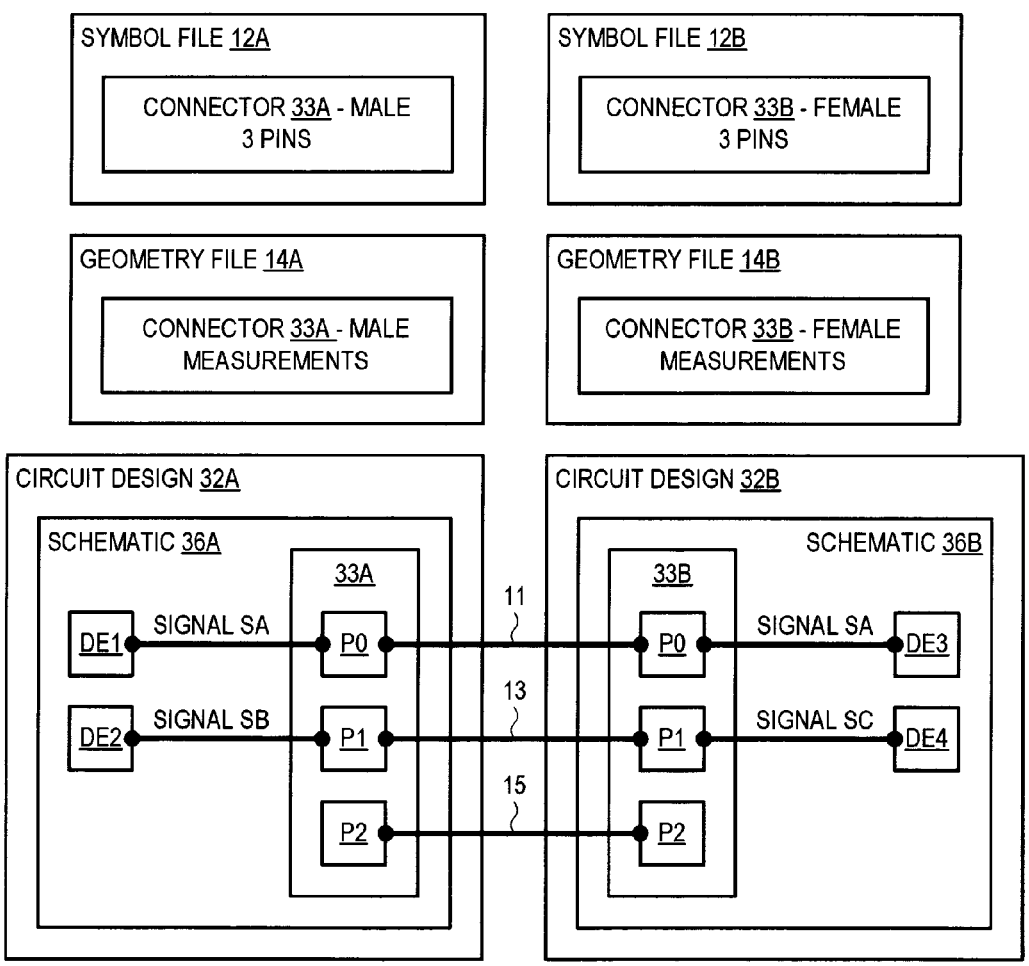
FIG. 2 illustrates a mapping file defining interconnectivity between two circuit designs.
FIG. 3 is a block diagram illustrating two interconnected circuit designs, and associated symbol and geometry files.

FIG. 2 shows further detail of an exemplary mapping file 16. FIG. 3 shows further detail of exemplary symbol and geometry files 12, 14, respectively, and an illustrative example of circuit designs 32, including schematics 36. FIG. 2 and FIG. 3 should be viewed together in conjunction with the following description. In particular, FIG. 3 shows exemplary mapping file 16 correlating connections between circuit designs 32A and 32B, FIG. 1. In one embodiment, mapping file 16 is initially generated from a list created by design engineers during development of circuit designs 32. In FIG. 3, symbol file 12A defines a connector 33A as a male connector with three pins, and symbol file 12B defines a second connector 33B as a female connector with three pins. In this example, connectors 33 are designed to couple together, to form an electrical connection between pins, i.e., connector 33A P0 to connector 33B P0, connector 33A P1 to connector 33B P1, and connector 33A P2 to connector 33B P2. Geometry files 14A and 14B define the size and geometry of connectors 33A and 33B, respectively.

Circuit design 32A, as illustrated in FIG. 3, includes connector 33A and design elements DE1 and DE2. Design elements DE1 and DE2 are, for example, components (e.g., resistors, capacitors, transistors) of circuit design 32A. Similarly, circuit design 32B includes connector 33B and design elements DE3 and DE4. Design elements DE3 and DE4 are, for example, components (e.g., resistors, capacitors, transistors) of circuit design 32B. As connector 33A has three pins P0, P1 and P2 that couple with pins P0, P1 and P2 of connector 33B, the connection between these pins is illustratively shown by connections 11, 13 and 15, respectively.

To better illustrate connectivity between circuit designs 32, an illustrative example is now provided. In the example, DE1 produces a signal SA that connects to pin P0 of connector 33A and P0 of connector 33B (through connection 11), resulting in signal SA input to DE3. DE2 produces a signal SB that connects to pin P1 of connector 33A and P1 of connector 33B (through connection 13), resulting in signal SC input to DE4, as shown. In mapping file 16, FIG. 2, each row 27, 29 represents one connection between circuit designs 32. First row 27 represents the connection from DE1 to DE3, where signal SA connects via pin P0 of connector 33A to signal SA via pin P0 of connector 33B. Similarly, row 29 represents the connection between DE2 and DE4, where signal SB connects via pin P1 of connector 33A to signal SC via pin P1 of connector 33B.

FIG. 4 illustrates an exemplary modification to circuit design 32A, for example as made by a first design engineer at user station 30A. The first design engineer modifies routing of signal SB, changing its connection from pin P1 of connector 33A to pin P2 of connector 33A. In one embodiment, processing section 20 detects this modification and automatically updates mapping file 16, shown in FIG. 5. In particular, processing section 20 changes the connectivity of signal SB from pin P1 to pin P2, in mapping file 16, FIG. 5, as indicated by modification 23. Processing section 20 then makes modification 25, to also change signal SD connectivity from pin P1 to pin P2 of connector 33B. In one embodiment, processing section 20 optionally updates schematics 36 to ensure correct connectivity between circuit designs 32, as shown in FIG. 6. In particular, processing section 20 modifies schematic 36A to make modification 21, as shown, thereby maintaining correct connectivity between circuit designs 32.

In one embodiment, upon detecting connectivity changes (e.g., modification 19, FIG. 4) between circuit designs 32, processing section 20 generates notifications 17, FIG. 1, that include warning messages detailing connectivity changes. The design engineers receive these notifications via user interface 22 (and user stations 30) and are prompted to modify schematics 36 within their responsibility. For example, the design engineer with responsibility for circuit design 32B may receive notification that modification 21, FIG. 6, is necessary to maintain connectivity.

Although FIG. 1 illustrates two user stations 30, two circuit designs 32A, 32B and two schematics 36A, 36B, it should be appreciated that the number of user stations 30, circuit designs 32 and schematics 36 is illustrative are not limiting. Similarly, the number of symbols and geometry files are shown illustratively and should not be considered limiting.

Figure 7:
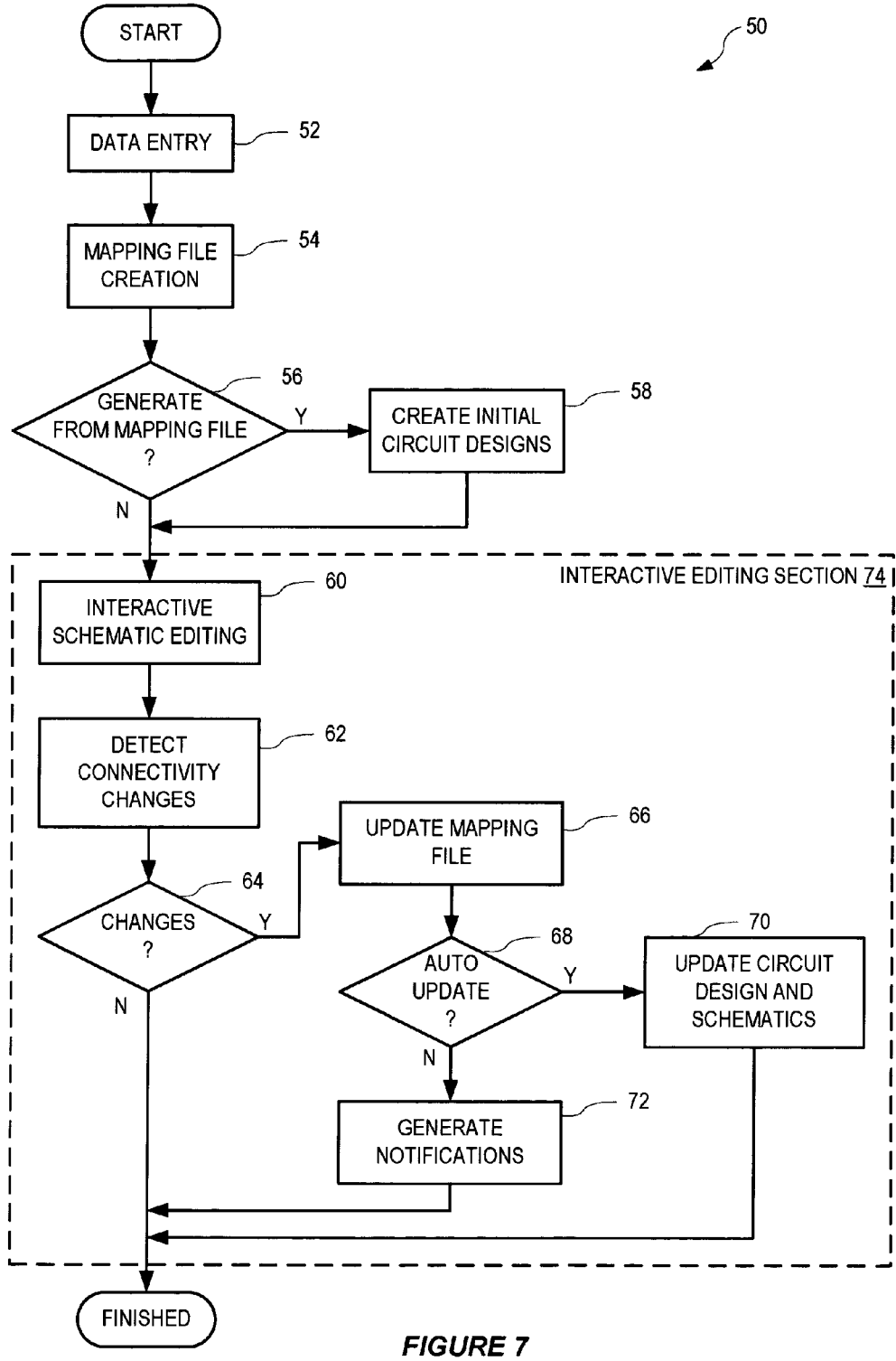
FIG. 7 is a flowchart illustrating one process for using common mapping files to ensure correct connectivity between circuit designs.

FIG. 7 is a flowchart illustrating one process 50 for using common mapping files (e.g., mapping file 16) to ensure correct connectivity between circuit designs (e.g., circuit designs 32, FIG. 1). Process 50 is for example implemented by processing section 20, FIG. 3, during design of product 48. In step 52, design engineers input product design information into system 10 (e.g., through user interface 22). By way of example, in step 52, interconnections of circuit designs 32 are entered into a list (e.g., using spreadsheet 49); the design engineers collaborate to generate the list of signals and pin connections for all circuit design interconnects using a spreadsheet program (or other similar software tool). In step 54, process 50 generates mapping file 16 by analyzing connectivity information input in step 52. For example, process 50 analyzes spreadsheet file 49 to produce mapping file 16. Step 56 is a decision. If process 50 is configured to automatically create initial circuit designs 32 and schematics 36, process 50 continues with step 58; otherwise process 50 continues with step 60. In step 58, process 50 determines the size and type of connectors required by analyzing mapping file 16. Optionally, step 58 may include input from the design engineers to select appropriate connectors. In step 58, process 50 may also determine power requirements and "spare pin" percentages to aid connector selection, as a matter of design choice. If board dimensions and connection locations are entered as input to step 52, then, in step 58, process 50 may also generate mechanical data for "fit analysis." Furthermore, if the data entered in step 52 defines connectors, signals and/or busses that use the connectors, process 50 may determine (in step 58) an optimal "pin-out" (optimal assignment of signals to pins) for the connectors. Consequently, in step 58, process 50 may initially create circuit designs and schematics (e.g., circuit designs 32 and schematics 36, FIG. 1).

In step 60, design engineers at user stations 30 interact through user interface 22 to modify schematics 36, and hence, circuit designs 32. For example, a first design engineer at user station 30A modifies schematic 36A to include addition components and circuitry, modifying connectivity of connector 33A (e.g., modification 19, FIG. 4). In step 62, process 50 detects changes to connectivity specified in mapping file 16. For example, in step 62, process 50 detects the changes to connector 33A (modification 19) made in step 60 by the first design engineer. Step 64 is a decision. If changes are detected in step 62, process 50 continues with step 66. In step 66, process 50 updates mapping file 16 with connectivity changes made in step 60. For example, in step 66, process 50 updates mapping file 16 with changes (modification 23) made to connector 33A by the first design engineer in step 60. Process 50 also makes modification 25 to mapping file 16 in order to correct the connectivity of circuit design 32B. Step 68 is a decision. If process 50 is configured to automatically update schematics and circuit designs with connectivity changes, process 50 continues with step 70; otherwise process 50 continues with step 72. In step 70, process 50 updates circuit designs 32 and schematics 36 with connectivity changes made in step 60. For example, in step 70, process 50 updates connector 33B in schematic 36B of circuit design 32B with connectivity changes made to connector 33A by the first design engineer (i.e., in the example, process 50 makes modification 21, FIG. 6). In step 72, process 50 optionally generates notifications 17 of connectivity changes made in step 60 and affecting mapping file 16. In step 72, process 50 then sends notifications 17 to responsible design engineers associated with the modifications via user interface 22. For example, in step 72, process 50 generates a warning message (in notification 17) containing details of the connectivity modifications (e.g., modification 21) of connector 33B due to changes (e.g., modification 19) made to connector 33A in step 60. Process 50 then ends as shown.

Steps 60 through 72 are collectively shown within interactive editing section 74 and are repeated as necessary during development of product 48, allowing modification of circuit designs 32 while automatically maintaining correct connectivity.

Figure 8:
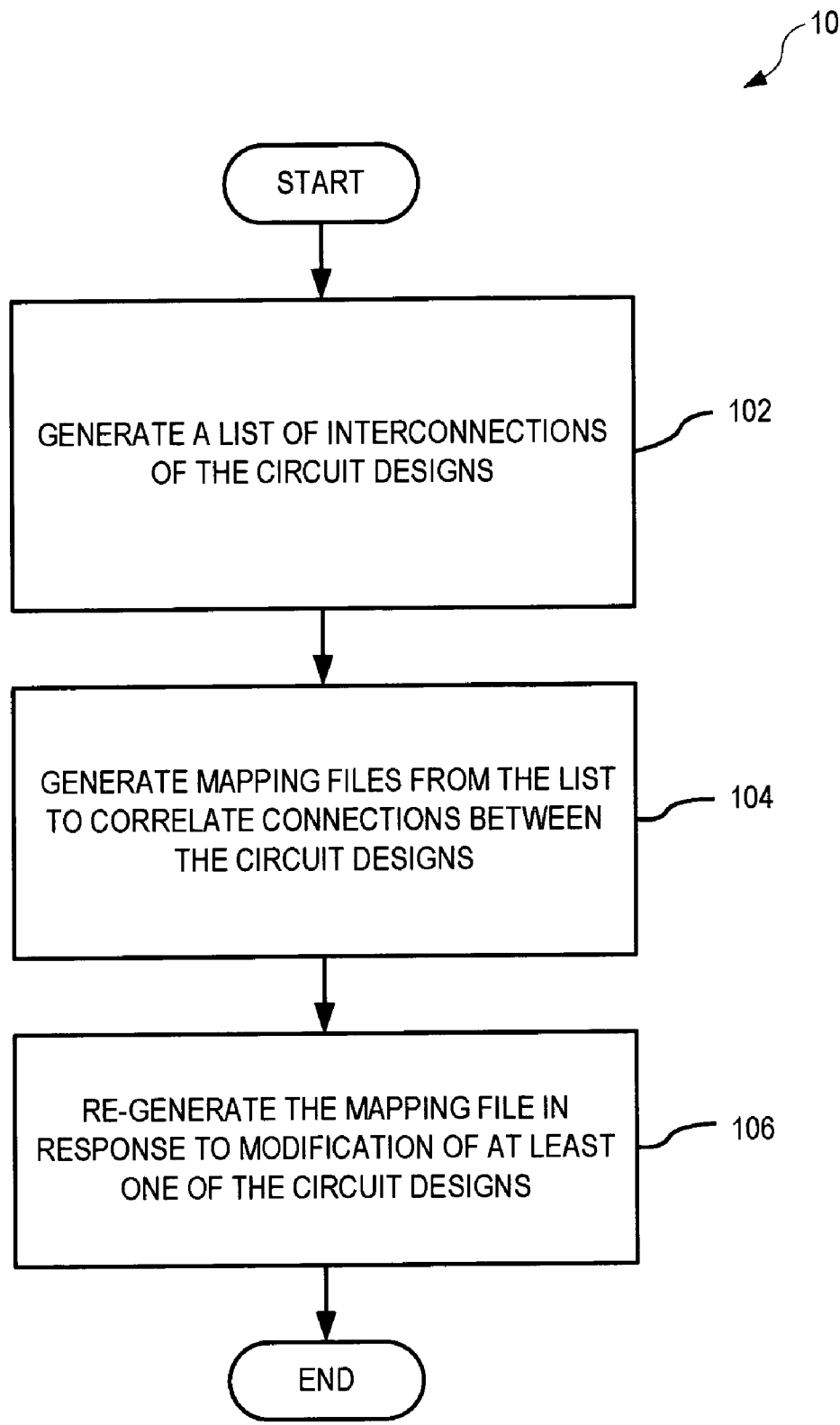
FIG. 8 is a flowchart illustrating one process for ensuring correct connectivity between circuit designs.

FIG. 8 is a flowchart illustrating one process 100 for ensuring correct connectivity of signals between two or more circuit designs (e.g., circuit designs 32, FIG. 1) of a product. Process 100 is for example implemented in processing section 20 of system 10 and used to create complex electronic product 48 that is constructed of multiple interconnecting circuit designs. In step 102, process 100 generates a list of interconnecting signals of the circuit designs. For example, in step 102, process 100 generates a list of interconnecting signals between circuit designs 23A and 32B, and stores them in spreadsheet 49. In step 104, process 100 generates a mapping file from the list, created in step 102, to correlate connections between the circuit designs. For example, process 100 generates mapping file 16 from spreadsheet 49, generated in step 102. In step 106, process 100 regenerates the mapping file in response to modification of at least one of the circuit designs. For example, mapping file 16 is re-generated in response to changes to circuit design 32A.

Upon reading and fully appreciating this disclosure, one of ordinary skill in the art appreciates that CAD system 10, FIG. 1, may have several advantages. Design engineers using CAD system 10 may reduce the effort spent in providing for "spare connectors" within circuit designs 32, since signal and pin assignments are captured by CAD system 10. Design engineers using CAD programs like Mentor may see further advantages in checking latent symbol and signal changes through CAD system 10, to further verify the CAD programs. CAD system 10 may also provide a single point of interface (e.g., user interface 22) to circuit designs and to acquire new schematics; a single set of pin assignments may also be utilized to agree, or not, upon numbers and signal assignments.

Changes may be made in the above methods and systems without departing from the scope hereof. It should thus be noted that the matter contained in the above description or shown in the accompanying drawings should be interpreted as illustrative and not in a limiting sense. For example, CAD system 10, FIG. 1, may be implemented using a client server model, allowing designers to cooperate from different locations. Further, each design engineer may also operate on a local copy of mapping file 16, so that modifications are first evaluated before becoming confirmed changes to all circuit designs. A version control mechanism may be used to check in and check out configuration files and the mapping file to facilitate and control global changes. Nonetheless, the following claims are intended to cover all generic and specific features described herein, as well as all statements of the scope of the present method and system, which, as a matter of language, might be said to fall there between.

What is claimed is:

1. A system for ensuring correct connectivity between circuit designs, comprising:
    configuration files defining connections of the circuit designs;
    at least one mapping file correlating connections between the configuration files; and
    a processing section for updating the mapping file in response to changes of the circuit designs, and for processing the configuration files and the mapping file in generating the circuit designs.

2. The system of claim 1, the mapping file initially being generated from a list of interconnectivity signals.

3. The system of claim 2, wherein the list comprises one or more spreadsheets.

4. The system of claim 2, further comprising a user interface for connection to one or more user stations used in generating the interconnectivity signals.

5. The system of claim 1, further comprising a user interface for connection to one or more user stations used in inputting the changes to the circuit designs.

6. The system of claim 1, wherein the configuration files comprise symbol files representing parts within the circuit designs.

7. The system of claim 6, wherein the configuration files comprise geometry files representing physical attributes of the parts.

8. The system of claim 1, the processing section responsive to design changes of at least one of the circuit designs to automatically update the mapping file.

9. The system of claim 8, the processing section responsive to updating of the mapping file to update at least one schematic for at least one of the circuit designs.

10. The system of claim 1, the processing section responsive to design changes of at least one connector of the circuit designs to automatically update the mapping file.

11. The system of claim 10, the processing section responsive to updating of the mapping file to generate at least one notification of the design changes.

12. The system of claim 1, wherein the processing section generates one or more notifications indicating connectivity changes between the circuit designs.

13. A system for ensuring correct connectivity between circuit designs, comprising:
    means for generating at least one mapping file to correlate connections between configuration files of the circuit designs;
    means for updating the mapping file in response to a change of the circuit design; and
    means for processing the configuration files and the mapping file in generating the circuit designs.

14. The system of claim 13, wherein the configuration files having one or both of symbol files and geometry files.

15. The system of claim 13, further comprising means for formulating the mapping file from an input list.

16. The system of claim 15, the input list comprising a spreadsheet.

17. A method for ensuring correct connectivity between circuit designs, comprising:
    A) generating a list of connections of the circuit designs;
    B) generating a mapping file from the list to correlate connections between the circuit designs; and
    C) re-generating the mapping file in response to modification of at least one of the circuit designs.

18. The method of claim 17, further comprising generating at least one schematic associated with at least one of the circuit designs using information in the regenerated mapping file.

19. A software product comprising instructions, stored on computer-readable media, wherein the instructions, when executed by a computer, perform steps for ensuring correct connectivity between circuit designs, comprising:
    instructions for generating a list of connections of the circuit designs;
    instructions for generating a mapping file from the list to correlate connections between the circuit designs; and
    instructions for re-generating the mapping file in response to modification of at least one of the circuit designs.

20. The software product of claim 19, further comprising instructions for generating at least one schematic associated with at least one of the circuit designs using information in the regenerated mapping file.

* * * * *